United States Patent
Nishikawa

(10) Patent No.: US 9,716,442 B2
(45) Date of Patent: Jul. 25, 2017

(54) POWER CONVERTER, ELECTRIC ROLLING STOCK AND METHOD FOR CONTROLLING SEQUENCE TEST

(75) Inventor: Katsuya Nishikawa, Chiyoda-ku (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 5 days.

(21) Appl. No.: 14/413,607

(22) PCT Filed: Jul. 13, 2012

(86) PCT No.: PCT/JP2012/067933
§ 371 (c)(1),
(2), (4) Date: Jan. 8, 2015

(87) PCT Pub. No.: WO2014/010079
PCT Pub. Date: Jan. 16, 2014

(65) Prior Publication Data
US 2015/0188451 A1    Jul. 2, 2015

(51) Int. Cl.
*H02M 7/537*    (2006.01)
*H02P 31/00*    (2006.01)
(Continued)

(52) U.S. Cl.
CPC .............. *H02M 7/537* (2013.01); *B60L 3/12* (2013.01); *B60L 9/22* (2013.01); *B60L 9/30* (2013.01);
(Continued)

(58) Field of Classification Search
None
See application file for complete search history.

(56) References Cited

U.S. PATENT DOCUMENTS

2007/0120536 A1* 5/2007 Runkle ............... H01M 10/441
                                                          320/136
2008/0296970 A1* 12/2008 Donnelly ................. B60L 7/06
                                                          307/9.1
(Continued)

FOREIGN PATENT DOCUMENTS

CN    101959709 A    1/2011
DE    198 43 110 A1    3/2000
(Continued)

OTHER PUBLICATIONS

Extended European Search Report dated Apr. 1, 2016, issued by the European Patent Office in the corresponding European Application No. 12881032.2. (8 pages).
(Continued)

*Primary Examiner* — Eduardo Colon Santana
*Assistant Examiner* — Said Bouziane
(74) *Attorney, Agent, or Firm* — Buchanan Ingersoll & Rooney PC

(57) ABSTRACT

A power conversion unit performs an AC mode or DC mode conversion operation in which AC or DC power is converted to power driving a motor in order to supply a load. In response to the output of a sequence test signal instructing execution of a sequence test, a power source output switching switch shuts off the supply of a power from a power source to the power conversion unit. When the sequence test signal has been output and the supply of power to the power conversion unit has been shut off by means of the power source output switching switch, a control unit controls the AC mode or DC mode in order to cause the power conversion unit to execute a conversion operation corresponding to the power supplied to the power conversion unit in accordance with the switching history of sequence test signal output and non-output.

8 Claims, 10 Drawing Sheets

(51) Int. Cl.
*B60L 9/30* (2006.01)
*B60L 3/12* (2006.01)
*B60L 9/22* (2006.01)
*B60L 15/32* (2006.01)
*B60L 15/00* (2006.01)
*G01M 17/08* (2006.01)
*G01R 31/28* (2006.01)
*G05B 23/02* (2006.01)

(52) U.S. Cl.
CPC ............ *B60L 15/007* (2013.01); *B60L 15/32* (2013.01); *G01M 17/08* (2013.01); *G01R 31/282* (2013.01); *G05B 23/0256* (2013.01); *H02P 31/00* (2013.01); *B60L 2200/26* (2013.01); *B60L 2210/40* (2013.01); *Y02T 10/7241* (2013.01)

(56) References Cited

U.S. PATENT DOCUMENTS

2011/0011300 A1* 1/2011 Gambach ............... B60L 9/30
                                                           105/49
2012/0000739 A1   1/2012 Nogi et al.

FOREIGN PATENT DOCUMENTS

| | | |
|---|---|---|
| DE | 10 2010 039 699 A1 | 3/2012 |
| JP | 49-34322 B | 3/1974 |
| JP | 59-014302 A | 1/1984 |
| JP | 59-183101 u | 12/1984 |
| JP | 11-155204 A | 6/1999 |
| JP | 2010-200576 A | 9/2010 |
| WO | 2010/125183 A1 | 11/2010 |

OTHER PUBLICATIONS

International Search Report (PCT/ISA/210) mailed on Oct. 23, 2012, by the Japanese Patent Office as the International Searching Authority for International Application No. PCT/J P2012/067933.
Written Opinion (PCT/ISA/237) mailed on Oct. 23, 2012, by the Jpanese Patent Office as the International Searching Authority for International Application No. PCT/JP2012/067933.
Chinese Office Action dated Sep. 20, 2016 issued in corresponding Chinese Patent Appln. No. 201280074663.7, with English translation (14 pages).

* cited by examiner

POWER CONVERTER, ELECTRIC ROLLING STOCK AND METHOD FOR CONTROLLING SEQUENCE TEST

TECHNICAL FIELD

The present disclosure relates to a power converter mounted in electric rolling stock and the like, an electric rolling stock mounted with power converter(s), and methods for controlling sequence tests that are performed on electric rolling stock and the like.

BACKGROUND ART

Power converters mounted in electric rolling stock, under the control of a control unit, convert power supplied from a power source via an overhead contact line into power for driving a traction motor. The converted power is output to a traction motor which runs the electric rolling stock.

In order to inspect whether the control unit is operating normally, a sequence test is performed that causes the control unit to execute control while the supply of power from an overhead contact line to the power converter is shut off. Patent Literature 1 for instance, presents a sequence test circuit of an AC electric rolling stock.

CITATION LIST

Citation List

Patent Literature

Patent Literature 1: Unexamined Japanese Patent Application Kokai Publication No. S59-14302

SUMMARY OF INVENTION

Technical Problem

In general, electric rolling stock, like that of an AC/DC dual purpose rolling stock, run by receiving differing types of supply power. Since operating parts and processes differ depending on the type of power supplied, it is necessary to perform sequence testing according to the type of power that the AC/DC dual purpose electric rolling stock mounted with power converters run on.

When a sequence test is performed, power converters, in principle, are not capable of automatically distinguishing whether the power being supplied is alternating current or direct current because the power source is separated from the power converters.

Even if a power converter were to be newly provided with a switch in order to distinguish the type of power, the accompanying increase in the number of parts of the power converter would likely result in a drop in reliability due to the increased size of the power converter and its more complex structure.

The present disclosure has been made in view of the above circumstances and aims to provide power converters and electric rolling stock with a simple configuration in which sequence tests according to the type of power can be easily executed and also provide a method for controlling the sequence tests.

Solution to Problem

In order to achieve the above-mentioned objective, a power converter according to the present disclosure comprises:

a power conversion unit that performs a first through a nth conversion operation that converts a first through a nth power, n being an integer of two or more, respectively into load-driving power supplied to a load;

a shutoff switch that in response to an output of a sequence test signal instructing execution of a sequence test, shuts off a supply of power from a power source to the power conversion unit; and a control unit that, when any of the first through the nth power is being supplied to the power conversion unit, executes any of a first through a nth controls in order to cause the power conversion unit to execute the conversion operation corresponding to the power being supplied, and when the sequence test signal has been output and the supply of power to the power conversion unit has been shut off by the shutoff switch, executes any of the first through the nth control in accordance with a switching history of sequence test signal output and non-output.

Advantageous Effects of Invention

With the present disclosure, any of the first through the nth controls is executed to the power conversion unit in accordance with the switching history of the sequence test signal output and non-output when the sequence test signal has been output and the supply of power to the power conversion unit has been shut off the shutoff switch. As a result, the switching between sequence test signal output and non-out can cause the power conversion unit to execute any of the first through the nth control. Thus, it is possible to easily execute a sequence test according to the power type using a simple configuration.

DESCRIPTION OF EMBODIMENTS

Hereinafter, the embodiments of the present disclosure are explained with reference to the drawings. The same reference number for the same element is used throughout all the drawings.

First Embodiment

Figure 1:
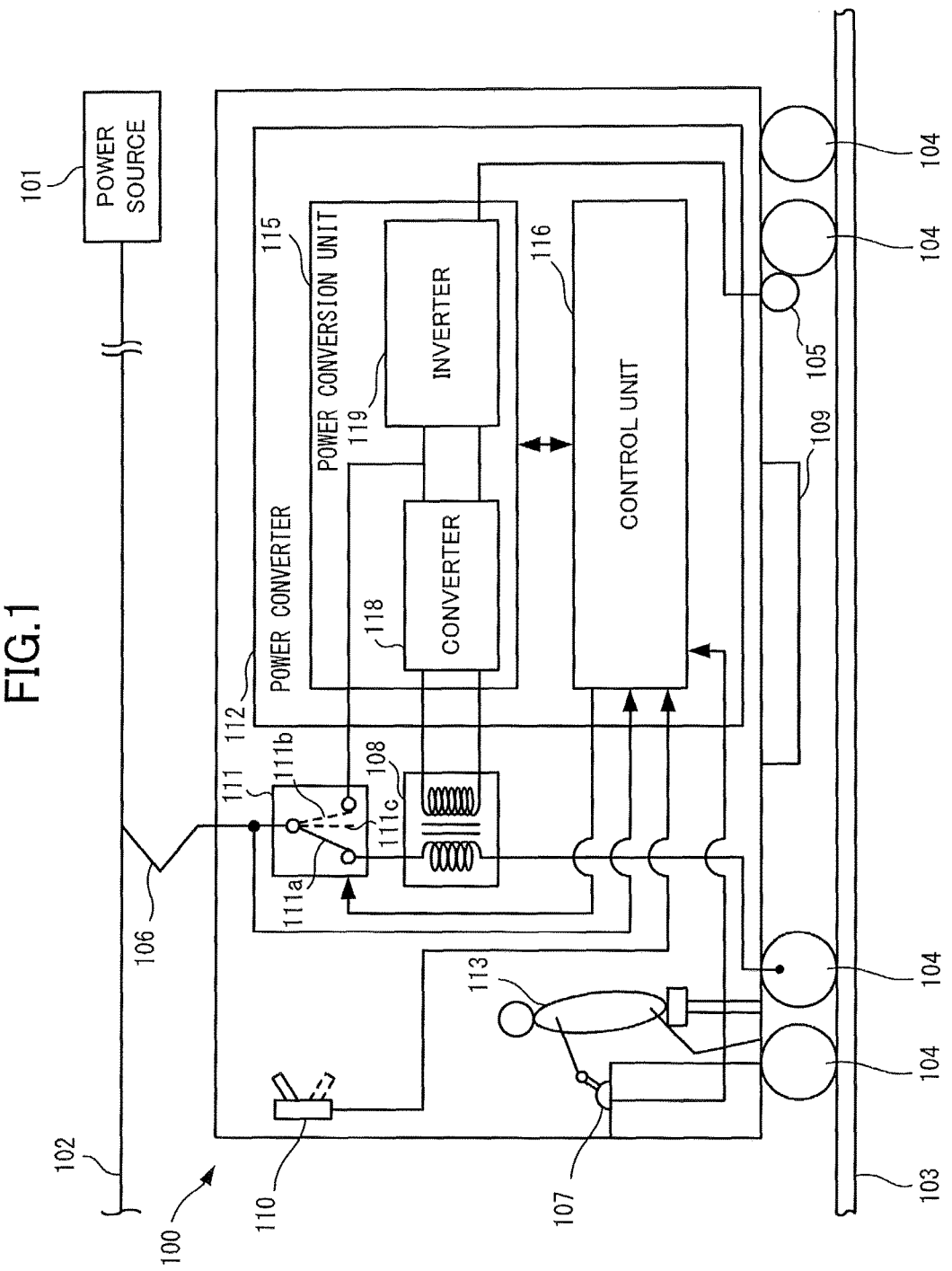
FIG. 1 is a drawing showing a schematic configuration of an electric rolling stock in a first embodiment.

As illustrated in FIG. 1, electric rolling stock 100 of a First embodiment of the present disclosure refers to trains, electric railcars, electric locomotives, and the like, that run on a rail 103 by means of power supplied via an overhead contact line (overhead contact line system) 102 from a power source 101. In order to facilitate understanding of the present disclosure in this embodiment, electric rolling stock 100 illustrated as a one-car train.

Electric rolling stock 100 is an AC-DC dual electric rolling stock that can run with power source 101 which can be either an alternating current (AC) power source or a direct current (DC) power source. When power source 101 is an AC power source, any alternating voltage and frequency can be employed, for instance, power source 101, can be a AC power source that supplies a power of 25 [kV] and 50 [Hz], 25 [kV] and 60 [Hz], 11.5 [kV] and 25 [Hz], or the like. Also, when power source 101 is a DC power source, any direct voltage can be employed, for instance, power source 101 can be a DC power source that supplies a power of 3 [kV], 1.5 [kV], or the like.

Electric rolling stock 100 includes a function for executing the sequence test. Here, the sequence test checks whether the control circuit of electric rolling stock 100 is operating normally by sending a notch command signal while the supply of power from power source 101 is shut off from the main circuit that includes a power converter 112 and the like.

Electric rolling stock 100 is an AC-DC dual electric rolling stock that can run with power source 101 which can be either an alternating current (AC) power source or a direct current (DC) power source however the operating parts or the control processes in electric rolling stock 100 differ depending on whether power source 101 is an AC power source or a DC power source. Therefore, electric rolling stock 100 includes functions to execute a sequence test each of AC mode and DC mode. The AC mode is the operation mode in response to an AC power source. The DC mode is the operation mode in response to a DC power source.

As illustrated in FIG. 1, electric rolling stock 100 physically includes wheels 104, a motor 105, a current collector 106, a master controller 107, a transformer 108, a battery 109, a sequence test switch 110, a power source output switching switch 111, and power converter 112.

Wheels 104 which, for instance are made of steel, support electric rolling stock 100. When electric rolling stock 100 runs, wheels 104 roll along the rail by rotating about axles not shown in the diagram.

Motor 105 is a traction motor, such as a three-phase induction motor, that transmits driving force for running electric rolling stock 100 to wheels 104 via a reduction gear and axles (not shown). Note that motor 105 can be a brushed DC electric motor, 1-phase commutator motor, or the like.

Current collector 106 is a device, for instance a pantograph, that acquires power that is supplied from power source 101 via an overhead contact line 102 into electric rolling stock 100.

Master controller 107 is a device that outputs a notch command signal for instructing electric rolling stock 100 to run, or more specifically to power run, coast, brake, and the like. Master controller 107 outputs a notch command signal in response to the operation of operating parts including handles and levers which are operated by a driver 113 of electric rolling stock 100, sequence test operators, and the like.

Transformer 108 provided with a primary coil and a secondary coil is a device that acquires a predetermined AC and converts the AC into a predetermined voltage, and in turn outputs the converted voltage of the AC current to power converter 112. The primary coil is electrically connected to the power source output switching switch 111 and wheels 104 acting as a ground connection. The secondary coil is electrically connected to power converter 112.

Battery 109 is an example of an on-board battery that supplies power to the control circuit of electric rolling stock 100, which for instance, is charged by power supplied from power source 101. The control circuits to which power is supplied from battery 109 include sequence test switch 110, master controller 107, power source output switching switch 111, power converter 112, a control unit 116, and the like. The wiring that connects battery 109 with the control circuits is not shown in FIG. 1 for simplicity of illustration.

Sequence test switch 110 is a switch for switching between output and non-output of a sequence test signal instructing execution of a sequence test. Sequence test switch 110, for instance, includes a lever, button and/or the like to be operated by a sequence test operator. Operation by a user causes sequence test switch 110 to switch between an output state that outputs a sequence test signal, and a non-output state that does not output a sequence test signal.

Power source output switching switch 111 is electrically connected to current collector 106. Power source output switching switch 111 switches, in accordance with the signal output from power converter 112, whether to output the power acquired by current collector 106, and switches to the output destination when the power is to be output.

Specifically, when sequence test switch 110 is in the non-output state and power source 101 is an AC power source, power source output switching switch 111 receives a signal from power converter 112 indicating that the power is AC, and in turn switches to AC-connected state 111a, hi AC-connected state 111a, current collector 106 is electrically connected to transformer 108.

When sequence test switch 110 is in the non-output state and power source 101 is a DC power source, power source output switching switch 111 receives a signal from power converter 112 indicating that the power is DC, and in turn switches to DC-connected state 111b. In DC-connected state 111b, current collector 106 is electrically connected to power converter 112 without involving transformer 108.

When the sequence test switch 110 is in the output state, power source output switching switch 111, serving as a shutoff switch, receives a sequence test signal via power converter 112, and in turn switches to a power source shutoff state 111c. In power source shutoff state 111c, since current collector 106 is not connected with either transformer 108 or power converter 112, power acquired by current collector 106 is shut off from the main circuit.

Power converter 112 comprises a power conversion unit 115 and a control unit 116, wherein power acquired by current collector 106 is supplied when electric rolling stock 100 is running, and converts the supplied power into a predetermined current, voltage, frequency, and the like which is then output to motor (load) 105.

Power conversion unit 115 performs a conversion operation under control of a control unit 116 in which AC power or DC power is converted into power for driving a motor 105 and then supplied to motor 105. The processing of conversion operation differs depending on the type of power source 101. When power source 101 is an AC power source, power conversion unit 115 performs an AC mode conversion operation (first conversion operation). When power source 101 is a DC power source, power conversion unit 115 performs a DC mode conversion operation (second conversion operation).

Power conversion unit 115 can employ a semiconductor power conversion device that uses silicon carbide semiconductors having a high breakdown voltage, and doing so makes it possible to reduce both the size and power consumption of power conversion unit 115.

Power conversion unit 115 includes converter 118 and inverter 119. When power source 101 is an AC power source, converter 118 acquires alternating-current, which is acquired by current collector 106, via power source output switching switch 111 and transformer 108. Converter 118, under a control of control unit 116, converts the acquired alternating-current into a predetermined direct-current which is then output to inverter 119.

When power source 101 is an AC power source, inverter 119 acquires direct-current from converter 118. When power source 101 is a DC power source, inverter 119 acquires direct-current from power source output switching switch 111. Inverter 119, under a control of control unit 116, converts the acquired direct-current into a three-phase electric power such as a predetermined current, voltage and frequency which is in turn output to motor 105.

Control unit 116 is a component of the structure of the control circuit of electric rolling stock 100 that controls power conversion unit 115, power source output switching switch 111, and the like based on a signal acquired from current collector 106, master controller 107 or sequence test switch 110. Control unit 116 set forth in this embodiment is comprised of a processor incorporating a predetermined software program.

Figure 2:
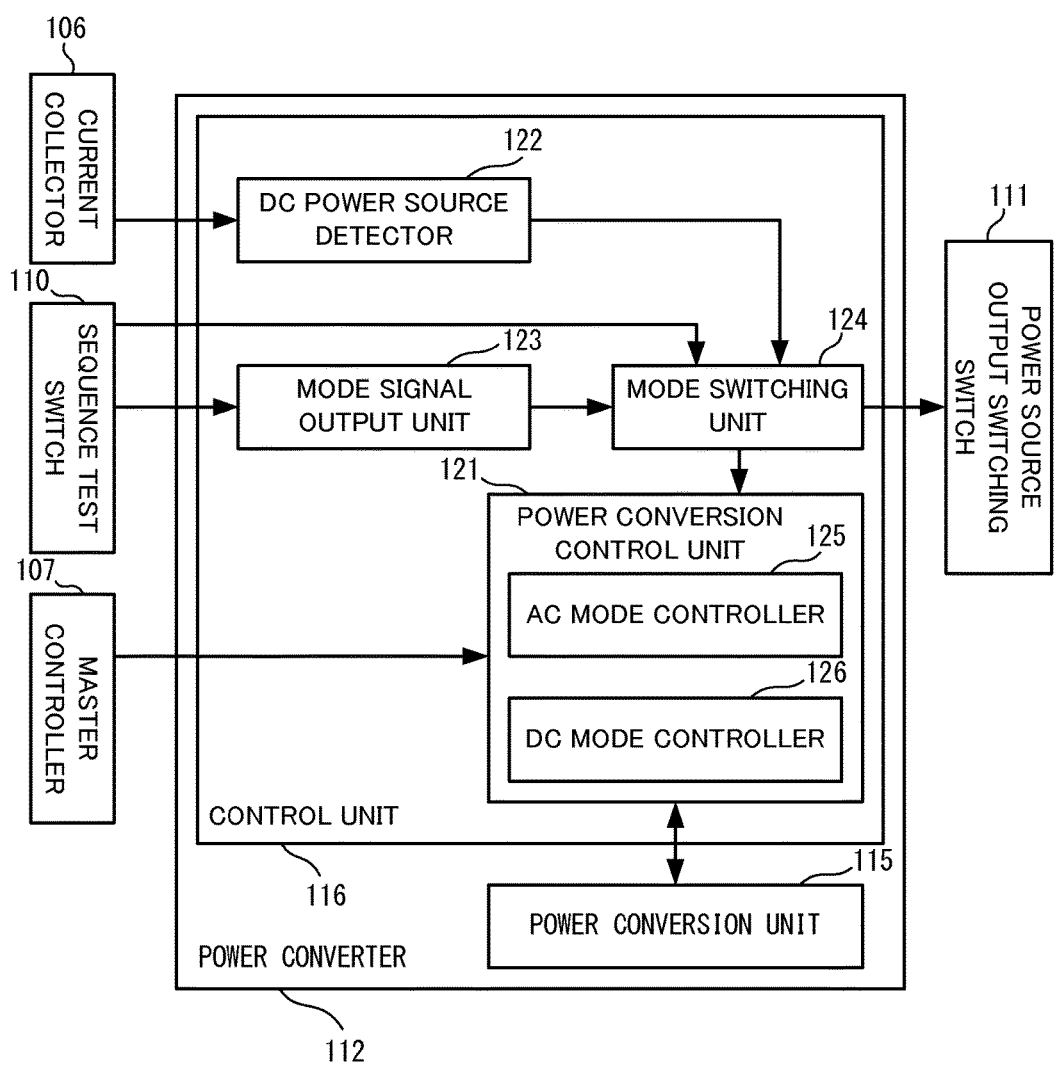
FIG. 2 is a drawing of a configuration of a power converter in the first embodiment.

As shown in FIG. 2, control unit 116 functionally includes a power conversion control unit 121, a DC power source detector 122, a mode signal output unit 123, and a mode switching unit 124.

Power conversion control unit 121, in accordance with the notch command signal output from master controller 107, executes control processing for executing a sequence test or running the electric rolling stock. As shown in the same diagram, the power conversion control unit 121 includes an AC mode controller 125 and a DC mode controller 126.

AC mode controller 125 executes control processing (first control) for executing a sequence test or running an electric rolling stock in AC mode. For instance, the execution of control processing in AC mode controller 125 causes power conversion unit 115 to perform an AC mode conversion operation.

DC mode controller 126 executes control processing (second control) for executing a sequence test or running an electric rolling stock in DC mode. For instance, the execution of control processing in DC mode controller 126 causes power conversion unit 115 to perform a DC mode conversion operation.

In this embodiment, the default mode is AC mode. In other words, when the operation mode was switched by mode switching unit 124 which is explained in detail later, power conversion control unit 121 operates in DC mode, and in other cases operates in AC mode.

Control processing which is executed by power conversion control unit 121 can be the same when executing a sequence test or running an electric rolling stock. In other words, when power conversion control unit 121 controls in AC mode or DC mode while power from power source 101 is shut off from the main circuit, the result is that a sequence test is executed in both modes. When power conversion control unit 121 controls power conversion unit 115 in each mode while power from power source 101 is supplied to power conversion unit 115, power in response to the sequence test signal is output from power conversion unit 115 to motor 105. As a result, electric rolling stock 100 runs in response to the notch command signal.

DC power source detector 122 acquires power acquired by current collector 106 as a power source signal indicating the type of power source 101. When power source 101 is detected to be a DC power source based on the power source signal, DC power source detector 122 outputs a DC power source detector signal indicating that the DC power source is detected.

Mode signal output unit 123 detects the fact that the sequence test signal was switched from output to non-output. And, when a sequence test signal is output within the fixed time T1 [sec.] (for example, 1 second), from the point in time at which switching is detected (reference time), mode signal output unit 123 outputs a mode signal for specifying DC mode. When the sequence test signal detected is not within T1 [sec.] from the reference time, mode signal output unit 123 does not output a mode signal. In other words, mode signal output unit 123 retains the history of the sequence test signal that was switched from output to non-output within the fixed time T1 [sec.] prior to the sequence test signal being output, and outputs a mode signal based on the history.

Mode switching unit 124 switches the operation mode of power conversion control unit 121 from AC mode, which is the default mode, to DC mode.

When the electric rolling stock is running, in other words, when current collector 106 is acquiring power from overhead contact line 102 while sequence test switch 110 is in the non-output state, mode switching unit 124 switches the operation mode based on the DC power source detector signal from DC power source detector 122.

In more detail, when DC power source detector signal is being output from DC power source detector 122 while sequence test switch 110 is in the non-output state, mode switching unit 124 switches the operation mode of power conversion control unit 121 to DC mode.

When DC power source detector signal from DC power source detector 122 is not being output while sequence test switch 110 is in the non-output state, mode switching unit 124 does not switch the operation mode of power conversion control unit 121. As a result, the operation mode of power conversion control unit 121 is set to AC mode which is the default mode.

When the sequence test is executed, in other words, while sequence test switch 110 is in the output state, mode switching unit 124 switches the operation mode based on the mode signal from mode signal output unit 123.

In more detail, when a mode signal is not being output from mode signal output unit 123 while sequence test switch 110 is in the output state, mode switching unit 124 does not switch the operation mode of power conversion control unit 121. As a result, the operation mode of power conversion control unit 121 is set to AC mode which is the default mode.

When a mode signal is being output from mode signal output unit 123 while sequence test switch 110 is in the output state, mode switching unit 124 switches the operation mode of power conversion control unit 121 to DC mode.

Mode switching unit 124 also outputs to power source output switching switch 111 a signal for switching between states 111a-111c of power source output switching switch 111.

In more detail, when a DC power source detector signal is not being output from DC power source detector 122 while sequence test switch 110 is in the non-output state, mode switching unit 124 outputs to power source output switching switch 111 a signal for switching to AC-connected state 111a.

When a DC power source detector signal is being output from DC power source detector 122 while sequence test switch 110 is in the non-output state, mode switching unit 124 outputs to power source output switching switch 111 a signal for switching to DC-connected state 111b.

While sequence test switch 110 is in the output state, mode switching unit 124 outputs to power source output switching switch 111 a sequence test signal as a signal for switching to power source shutoff state 111c.

This concludes the explanation with respect to the configuration of electric rolling stock 100 of this embodiment. Hereinafter, the operation of electric rolling stock 100 of this embodiment is explained.

Figure 3:
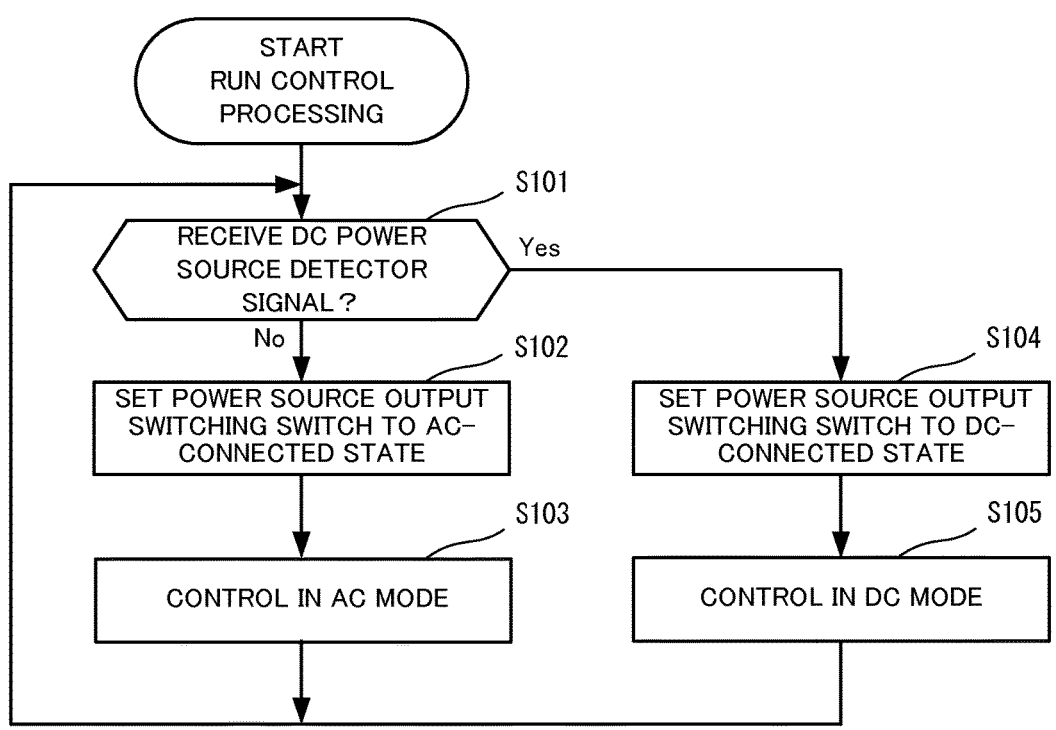
FIG. 3 is a flow chart showing a flow of run control processing in the first embodiment.

While sequence test switch 110 is in the non-output state, control unit 116 executes run control processing as shown in FIG. 3. As previously indicated, AC mode is the default mode of power conversion control unit 121.

Mode switching unit 124 recognizes whether a DC power source detector signal output from DC power source detector 122 is received (Step S101).

When it is recognized that DC power source detector signal has not been received (Step S101; No), mode switching unit 124 outputs to power source output switching switch 111 a signal indicating that power source 101 is an AC power source. Power source output switching switch 111 sets to AC-connected state 111a (Step S102).

Since a DC power source detector signal is not being received, mode switching unit 124 does not switch the operation mode of power conversion control unit 121. Therefore, power conversion control unit 121 remains set to AC mode, AC mode controller 125 controls power conversion unit 115 in AC mode in accordance with the notch command signal (Step S103).

In this way, the AC power supplied from power source 101 which is an AC power source, is converted in response to notch command signal into power for driving motor 105 and then supplied to motor 105. Therefore, electric rolling stock 100 can run on AC power.

When it is recognized that DC power source detector signal has been received (Step S101; YES), mode switching unit 124 outputs to power source output switching switch 111 a signal indicating that power source 101 is a DC power source. Power source output switching switch 111 sets to DC-connected state 111b (Step S104).

Since a DC power source detector signal was received, mode switching unit 124 switches the operation mode of power conversion control unit 121 to DC mode. As a result, DC mode controller 126 controls power conversion unit 115 in accordance with the notch command signal (Step S105).

In this way, the power supplied from power source 101 which is a DC power source, is converted in response to notch command signal into power for driving motor 105 and then supplied to motor 105. Therefore, electric rolling stock 100 can run on DC power.

As described, when electric rolling stock 100 is running, it operates according to whether power source 101 is an AC power source or a DC power source. In this way, electric rolling stock 100 can run regardless of whether power source 101 is an AC power source or a DC power source.

Figure 4:
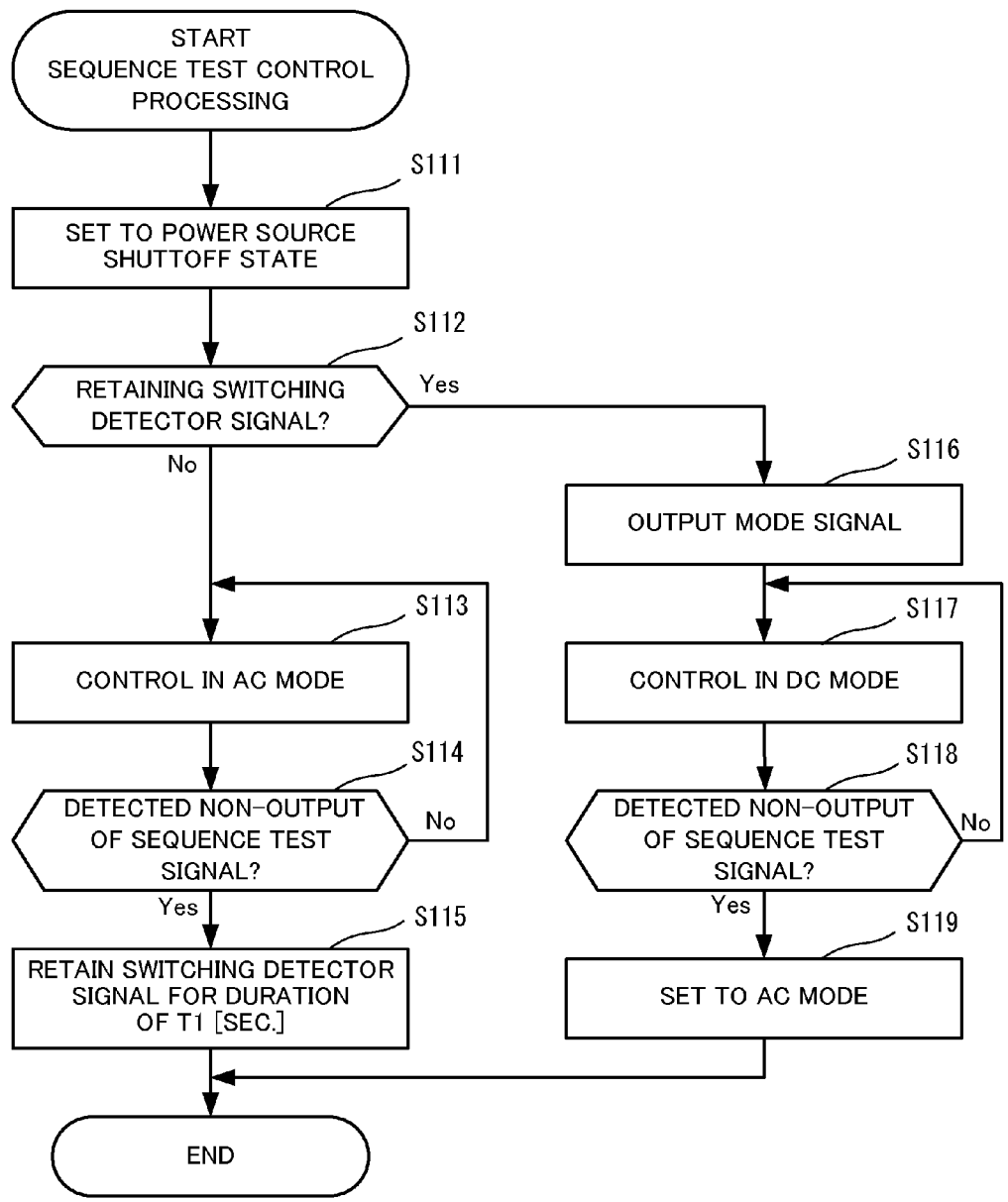
FIG. 4 is a flow chart showing a flow of sequence test control processing in the first embodiment.

While sequence test switch 110 is in the output state, control unit 116 executes sequence test control processing as shown in FIG. 4. In more detail, for instance, when mode switching unit 124 acquires a sequence test signal from sequence test switch 110, control unit 116 begins sequence test control processing. When sequence test control processing begins, the operation mode of power conversion control unit 121 is set to AC mode which is the default mode.

When mode switching unit 124 acquires a sequence test signal from sequence test switch 110, the sequence test signal is output to power source output switching switch 111. Power source output switching switch 111 sets to power source shutoff state 111c (Step S111).

When a sequence test signal from sequence test switch 110 is acquired, mode signal output unit 123 recognizes whether a switching detector signal is retained (Step S112). Here, the switching detector signal is a signal retained by mode signal output unit 123 for fixed time T1 [sec.] from the reference tune that is the point in time at which the switching of the sequence test signal from output to non-output is detected. In other words, the switching detector signal is the signal indicating the history of the sequence test signal that was switched from output to non-output within the fixed time T1 [sec.].

When it is recognized that a switching detector signal is not retained (Step S112; No), mode signal output unit 123 does not output a mode signal. Therefore mode switching unit 124 does not switch the operation mode of power conversion control unit 121. As a result, power conversion control unit 121 remains set in AC mode, and AC mode controller 125, in accordance with the notch command signal, executes control in order to cause power conversion unit 115 to execute the AC mode conversion operation (Step S113).

At this time, the sequence test can be executed in AC mode because the supply of power to power conversion unit 115 is shut off.

When the sequence test signal is not switched from output to non-output, mode signal output unit 123 does not detect a switch of a sequence test signal from output to non-output (Step S114; No). In this case, the power source output switching switch 111 remains in power source shutoff state 111c and AC mode controller 125 continues to execute control processing of AC mode (Step S113). In this way, the sequence test in AC mode can be continued.

When the sequence test signal is switched from output to non-output, mode signal output unit 123 detects a switch of a sequence test signal from output to non-output (Step S114; Yes). Mode signal output unit 123 retains the switching detector signal for the fixed time T1 [sec.] from the point in time at which switching is detected (reference time) (Step S115). In this way, the designated time T1 [sec.] from the reference time is measured and the history of the sequence test signal switching from output to non-output is retained just for this time T1 [sec.]. Control unit 116 ends the sequence test control processing.

Thereafter, when sequence test signal is output again from sequence test switch 110, sequence test processing is executed. With power source output switching switch 111 set to power source shutoff state 111c (Step S111), mode signal output unit 123 recognizes whether a switching detector signal is retained (Step S112).

When the point in time at which the sequence test signal output again is within T1 [sec.] from the reference time set in Step S115, the switching detector signal is retained in mode signal output unit 123. In this case, mode signal output unit 123 recognizes that the switching detector signal is retained (Step S112; Yes), and outputs to mode switching unit 124 a signal for specifying DC mode (Step S116).

Note that when the point in time at which the sequence test signal output again is not within T1 [sec.] from the reference time set, the switching detector signal is not retained in mode signal output unit 123. Therefore, in this case, mode signal output unit 123 recognizes that switching detector signal is not retained (Step S112; No), and processing proceeds through previously mentioned Steps S113-S115.

Upon receipt of the mode signal output in Step S116, mode switching unit 124 switches the operation mode of power conversion control unit 121 to DC mode. As a result, DC mode controller 126, in accordance with the notch command signal, executes control in order to cause power conversion unit 115 to execute the DC mode conversion operation (Step S117).

At this time, the sequence test can be executed in DC mode because the supply of power to power conversion unit 115 is shut off.

When the sequence test signal is not switched from output to non-output, mode switching unit 124 does not detect a switch of a sequence test signal from output to non-output (Step S118; No). In this case, the power source output switching switch 111 remains in power source shutoff state 111c and DC mode controller 126 continues to execute control processing of DC mode (Step S117). In this way, the sequence test of DC mode can be continued.

When the sequence test signal is switched from output to non-output, mode switching unit 124 detects a switch of a sequence test signal from output to non-output (Step S118; Yes). Mode switching unit 124 sets the operation mode of power conversion control unit 121 to AC mode which is the default mode (Step S119). Control unit 116 ends the sequence test control processing.

Note that when the sequence test signal is switched from output to non-output, mode switching unit 124 detects a switch (Step S118; Yes), and mode signal output unit 123 may detect a switch of a sequence test signal from output to non-output.

And, if the switching detector signal is not retained when the switch is detected, mode signal output unit 123 can retain the switching detector signal for T1 [sec.] from the point in time at which switching is detected (reference time).

If mode signal output unit 123 is retaining the switching detector signal when the switch is detected, the point in time at which the switch is detected is re-set as the reference time, and the switching detector signal for T1 [see.] from the time the reference time re-set may be retained but the re-setting of reference time is not necessary.

According to sequence test control processing of this embodiment, the sequence test can be executed in AC mode once sequence test switch 110 switches from the non-output state to the output state. And, when sequence test switch 110 switches back to the output state, the sequence test can be executed in DC mode if the switch occurs within T1 [sec.] from the reference time, in which sequence test switch 110 switched from the output state to the non-output state, if the switch occurs after T1 [sec.] from the reference time has passed, the sequence test in AC mode can be executed because the switching detector signal is not retained.

As described, by simply performing the predetermined operation to sequence test switch 110, the operation mode of power conversion control unit 121 switches allowing the sequence test to be executed. The operation mode is determined by the type of power. Therefore, it is possible to easily execute a sequence test according to the power type with a simple configuration.

In this embodiment, reference time is the point in time at which the sequence test signal is switched from output to non-output. In this way, when there is no history in which the output switched to non-output before the sequence test signal is output, a sequence test in AC mode which is the default mode can be immediately executed. Also, after the sequence test in AC mode is executed, when the sequence test signal is set to non-output and then the sequence test signal is output again within T1 [sec.], the sequence test in DC mode can be executed. Thus, when sequence tests in different operation modes are to be executed repetitively, it possible to execute the sequence test in each operation mode by simple operation of sequence test switch 110.

In this embodiment, when a mode signal for specifying DC mode is not output, power conversion control unit 121 controls in AC mode which is the default mode. Therefore, when executing a sequence test in the operation mode set as the default mode, the sequence test signal only needs to be switched once from non-output to output. Thus, the sequence test in AC mode, which is the default mode, can be executed with an extremely simple operation. Thus, the sequence test in AC mode, which is the default mode, can be executed with an extremely simple operation.

The first embodiment was explained, but the description of the embodiment is not limiting.

For example, although electric rolling stock 100 of this embodiment was presented as an AC-DC dual electric rolling stock, it also includes electric rolling stock that can run on differing types of power. In other words, the two types of power sources for running electric rolling stock 100 are not limited to an AC power source and a DC power source. For example the two types of power sources may be two AC power sources different in both voltage and frequency or either alone, or may also be two types of DC power sources with different voltages.

For instance, when power is acquired from a third rail in instead of from overhead contact line 102, a collector shoe can be employed in current collector 106 instead of a pantograph. Also, in cases when the device that acquires power switches according to the type of power source 101, electric rolling stock 100 may comprise a current collector 106 which includes both a pantograph and a collector shoe.

For instance, FIG. 1 shows an example of sequence test switch 110 and power source output switching switch 111 included on the exterior of power converter 112. However, either sequence test switch 110 or power source output switching switch 111, or both, can be included on the interior of power converter 112.

For instance, power source output switching switch 111 may acquire a sequence test signal directly from sequence test switch 110, and in this case, the states 111a-111c can be switched according to the sequence test signal and instruction from power converter 112. Power source output switching switch 111 may acquire a signal or power source signal directly from DC power source detector 122, and in this case, the states 111a-111c can be switched according to the sequence test signal.

For instance, the power source signal that DC power source detector 122 acquires can be a signal indicating the type of power source 101, and the voltage and current of power acquired by current collector 106 can be suitably converted through electronic elements and the like.

For instance, FIG. 1 shows an example of DC power source detector 122 included on the interior of power converter 112 but DC power source detector 122 can alternatively be included on the exterior of power converter 112.

For instance, the mode signal can be a signal for specifying the operation mode of a sequence test. In contrast to the embodiment, in cases where the default mode of power conversion control unit 121 is in DC mode, the mode signal output when the sequence test signal is acquired within T1 [sec.] from the reference time, can be a signal for specifying DC mode.

For instance, when the sequence test signal acquired is at a time not within T1 [sec.] from the reference time, mode signal output unit 123 can output the mode signal for specifying AC mode.

Figure 5:
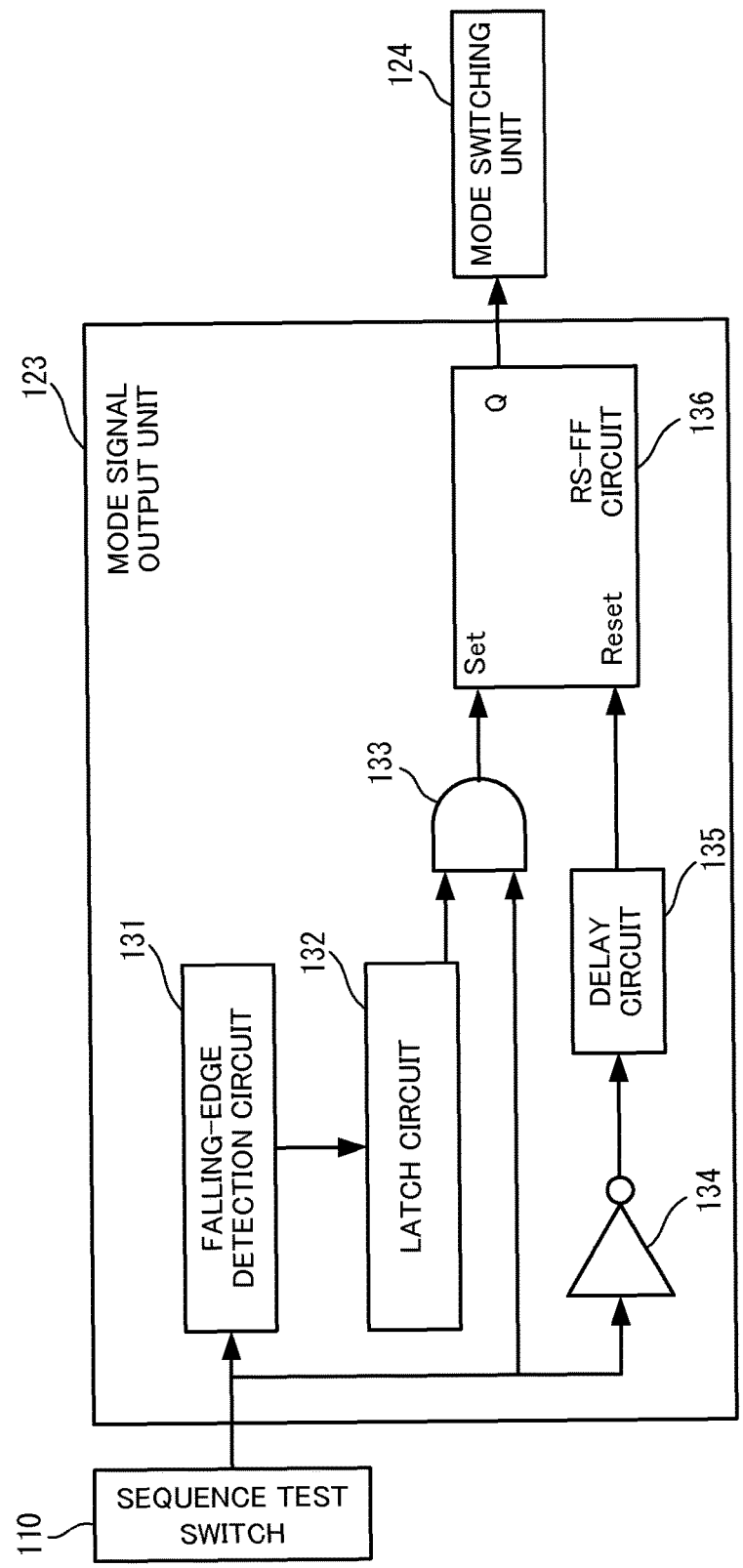
FIG. 5 is a logic circuit diagram showing a configuration of a mode signal output unit in the first embodiment.

For instance, some or all of the functions included in control unit 116 can be configured by logic circuits, FIG. 5 shows an example of mode signal output unit 123 configured by logic circuits. As shown in the same figure, mode signal output unit 123 includes a falling-edge detection circuit 131, a latch circuit 132, an AND circuit 133, a NOT circuit 134, a delay circuit 135, and a RS-FF (Reset Set-Flip Flop) circuit 136.

Falling-edge detection circuit 131 detects falling edges when the sequence test signal output from sequence test switch 110 changes from output to non-output. When falling-edge detection circuit 131 detects a falling edge, a predetermined signal is output to latch circuit 132.

When latch circuit 132 acquires the signal from falling-edge detection circuit 131, a predetermined signal is continuously output for a fixed time T1 [sec.] In other words, the signal that latch circuit 132 continuously outputs is corresponds to the switching detector signal explained in the first embodiment.

AND circuit 133 outputs a Set signal to RS-FF circuit 136 only when the switching detector signal from latch circuit 132 is output and the sequence test signal is being output from sequence test switch 110.

When the sequence test signal from sequence test switch 110 is non-output, NOT circuit 134 outputs a predetermined signal to delay circuit 135. While the sequence test signal from sequence test switch 110 is being output, NOT circuit 134 does not output a signal.

When delay circuit 135 acquires a signal from NOT circuit 134, after fixed time T2 [sec.], a Reset signal is output to RS-FF circuit 136. T2 [sec.] can be any time as long as it is equal to or longer than T1 [sec.].

When a Set signal is acquired, RS-FF circuit 136 outputs the predetermined signal to mode switching unit 124 and retains that state. Upon acquiring the Reset signal, RS-FF circuit 136 deactivates the signal outputting state. In other words, the signal output by RS-FF circuit 136 corresponds to the mode signal explained in the first embodiment.

This logic circuit operates in the same way as mode signal output unit 123 explained in the first embodiment and is comprised of electronic circuits. By appropriately combining the functions provided in the electronic circuits with the useful functions that can be provided by a processor executing installed software, the functions of control unit 116 explained in the first embodiment can be achieved.

Second Embodiment

The power converter of this embodiment, unlike in the first embodiment, is mounted in an electric rolling stock that can run on power supplied from any of three types of power sources (first to third power sources). Therefore, the power converter of this embodiment provides functions for executing a sequence test in the operation mode (first mode to third modes) in response each of the three types of power sources.

Any power sources can be utilized as the first to third power sources. With respect to the power source of this embodiment, the first power source shall be an AC power source while the second and third power sources shall be DC power sources with different voltages.

Figure 6:
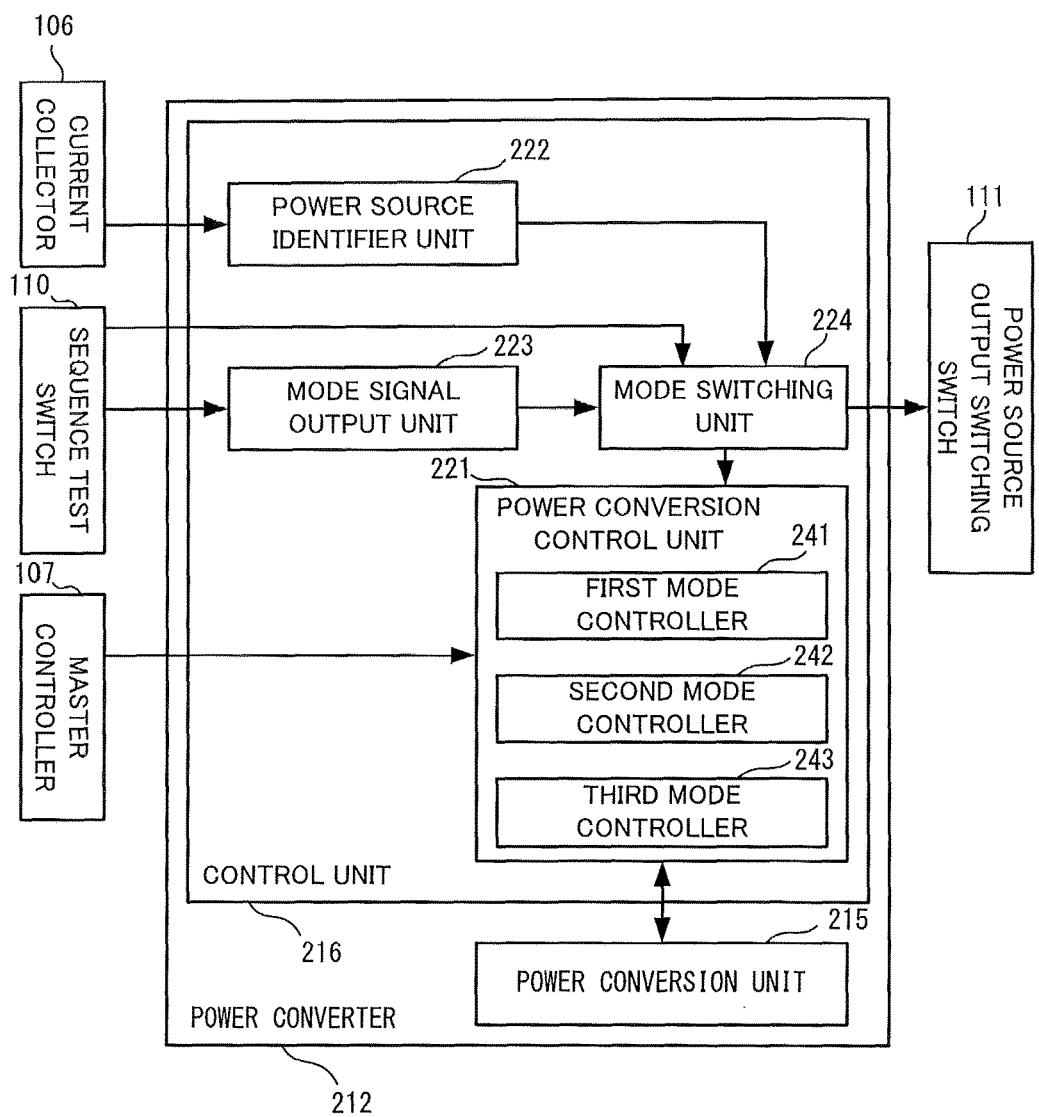
FIG. 6 is a diagram showing a configuration of a power converter in a second embodiment.

As shown in FIG. 6, power converter 212 of this embodiment includes a power conversion unit 215 and a control unit 216.

Power conversion unit 215 is a power conversion device that performs a conversion operation under the control of control unit 216, in which any of the first to third powers is converted into power for driving a motor 105 and then supplied to motor 105. When a power source is the first power source, power conversion unit 215 performs a first mode conversion operation (first conversion operation). When a power source is the second power source, power conversion unit 215 performs a second mode conversion operation (second conversion operation). When a power source is the third power source, power conversion unit 215 performs a third mode conversion operation (third conversion operation).

As shown in FIG. 2, control unit 216 includes a power source identifier unit 222, a mode signal output unit 223, a power conversion control unit 221, and a mode switching unit 224 instead of the respective parts of the first embodiment referred to as DC power source detector 122, mode signal output unit 123, power conversion control unit 121, and mode switching unit 124.

Power source identifier unit 222 identifies whether the power source is the first, second or third power source, and based on the identification result outputs the predetermined power source identity signal to mode switching unit 224.

In more detail, for instance, when the first power source is identified as the power source, power source identifier unit 222 does not output a power source identity signal. When the second power source is identified as the power source, power source identifier unit 222 outputs a power source identity signal indicating 1 for instance. When power source identifier 222 identifies the third power source as the power source, power source identifier unit 222 outputs a power source identity signal indicating 2 for instance.

Mode signal output unit 223 detects the fact that the sequence test signal was switched from output to non-output just like mode signal output unit 123 of the first embodiment.

Mode signal output unit 223 counts the number of times N the sequence test signal is switched from output to non-output within the fixed time T1 [sec.] from the point in time at which the switch is detected (reference time). Mode signal output unit 223 counts the number of times N the sequence test signal is switched from output to non-output within the fixed time T1 [sec.] from the point in time at which the switch is detected (reference time). In other words, mode signal output unit 223 retains the number of times N switched, as history of the sequence test signal that was switched from output to non-output within the fixed time T1 [sec.] prior to the sequence test signal being output, and outputs a mode signal based on that number of times.

When mode signal output unit 223 acquires a sequence test signal that is not within T1 [sec.] from the reference time, mode signal output unit 223 does not output a mode signal.

Power conversion control unit 221 executes control processing for executing a sequence test or running an electric rolling stock in accordance with the notch command signal output from master controller 107, just like power conversion control unit 121 of the first embodiment. As shown in the same diagram, power conversion control unit 221 includes a first mode controller 241, a second mode controller 242, and a third mode controller 243.

First mode controller 241 executes control processing (first control) for executing a sequence test or running an electric rolling stock in the first mode, which is the operation mode in accordance with the first power source. For instance, the execution of control processing in first mode controller 241 causes power conversion unit 215 to perform a first mode conversion operation.

Second mode controller 242 executes control processing for executing a sequence test or running an electric rolling stock in the second mode, which is the operation mode in accordance with the second power source. For instance, the execution of control processing in second mode controller 242 causes power conversion unit 215 to perform a second mode conversion operation.

Third mode controller 243 executes control processing for executing a sequence test or running an electric rolling stock in the third mode, which is the operation mode in accordance with the third power source. For instance, the execution of control processing in third mode controller 243 causes power conversion unit 215 to perform a third mode conversion operation.

In this embodiment, the default mode is the first mode. In other words, when the operation mode is switched by mode switching unit 224 which is explained in detail later, power conversion control unit 221 operates in either second or third mode, and in other cases operates in first mode.

Mode switching unit 224 switches the operation mode of power conversion control unit 221 from first mode, which is the default mode, to either second mode or third mode.

When the electric rolling stock is running, in other words, when current collector 106 is acquiring power from overhead contact line 102 while sequence test switch 110 is in the non-output state, mode switching unit 224 switches the operation mode based on the power source identity signal from power source identifier unit 222.

In more detail, when a power source identity signal is being output from power source identifier unit 222 while sequence test switch 110 is in the non-output state, mode switching unit 224 switches the operation mode of power conversion control unit 221 to first mode.

When a power source identity signal, that indicates the second power source is the power source, is being output from power source identifier unit 222 while sequence test switch 110 is in the non-output state, mode switching unit 224 sets the operation mode of power conversion control unit 221 to second mode.

When a power source identity signal, that indicates the third power source is the power source, is being output from power source identifier unit 222 while sequence test switch 110 is in the non-output state, mode switching unit 224 sets the operation mode of power conversion control unit 221 to third mode.

When the sequence test is executed, in other words, while sequence test switch 110 is in the output state, mode switching unit 224 switches the operation mode based on the mode signal from mode signal output unit 223.

In more detail, when a mode signal is not being output from mode signal output unit 223 while sequence test switch 110 is in the output state, mode switching unit 224 does not switch the operation mode of power conversion control unit 221. As a result, the operation mode of power conversion control unit 221 remains set to the first mode which is the default mode.

When a mode signal indicating 1 is being output from mode signal output unit 223 while sequence test switch 110 is in the non-output state, mode switching unit 224 switches the operation mode of power conversion control unit 221 to the second mode.

When a mode signal indicating 2 or higher is being output from mode signal output unit 223 while sequence test switch 110 is in the output state, mode switching unit 224 switches the operation mode of power conversion control unit 221 to the third mode.

Also, mode switching unit 224 outputs to power source output switching switch 111 a signal for switching between states 111a-111c of power source output switching switch 111.

In more detail, when a power source identity signal is not being output from power source identifier unit 222 while sequence test switch 110 is in the non-output state, mode switching unit 224 outputs to power source output switching switch 111 a signal for switching to AC-connected state 111a.

When a power source identity signal is being output from power source identifier unit 222 while sequence test switch 110 is in the non-output state, mode switching unit 224 outputs to power source output switching switch 111 a signal for switching to DC-connected state 111b.

While sequence test switch 110 is in an output state, mode switching unit 224 outputs to power source output switching switch 111 a signal for switching to power source shutoff state 111c.

This concludes the explanation with respect to the configuration of electric rolling stock of this embodiment. Hereinafter, the operation of electric rolling stock of this embodiment is explained.

Figure 7:
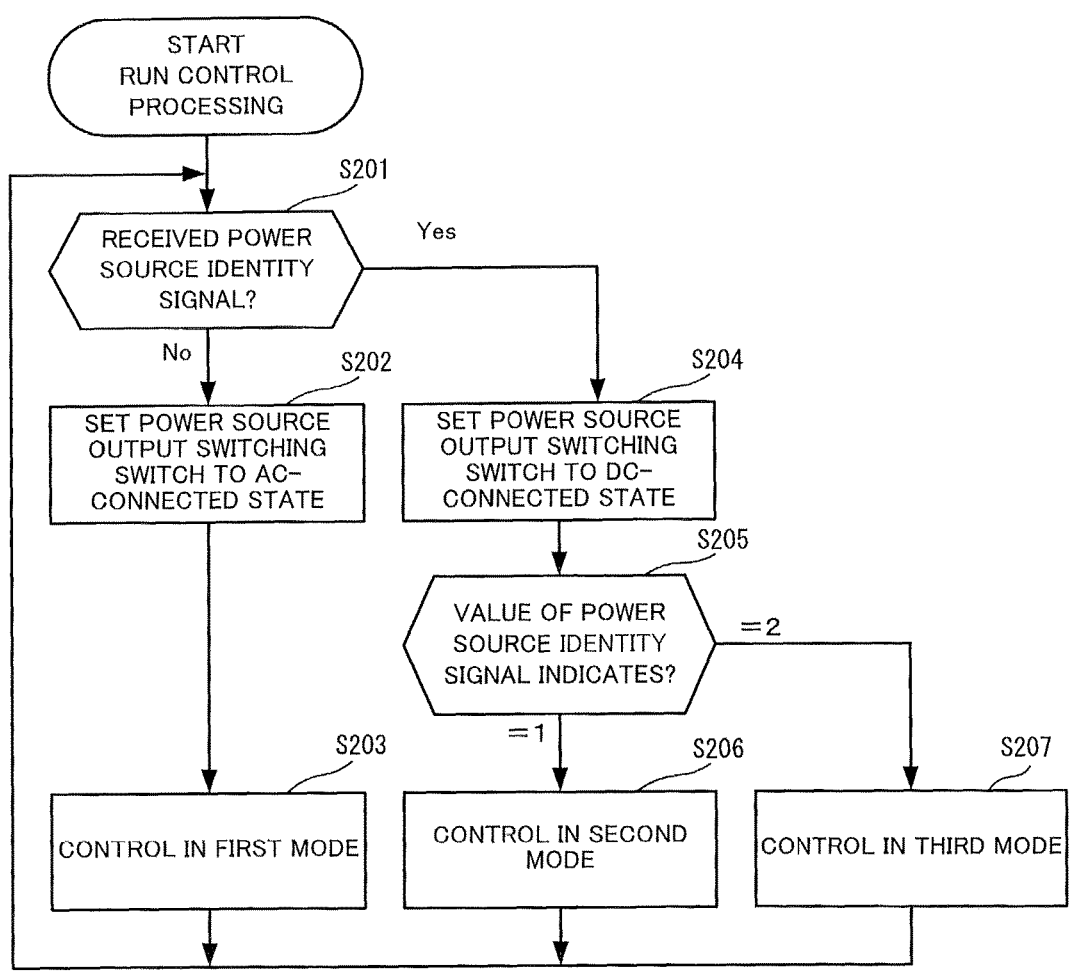
FIG. 7 is a flow chart showing a flow of run control processing in the second embodiment.

While sequence test switch 110 is in the non-output state, control unit 216 executes run control processing as shown in FIG. 7. As previously indicated, the first mode is the default mode of power conversion control unit 221.

Mode switching unit 224 recognizes whether a power source identity signal output from power source identifier unit 222 is received (Step S201).

When it is recognized that power source identity signal has not been received (Step S201; No), mode switching unit 224 outputs to power source output switching switch 111 a signal indicating that the power source is an AC power source. Power source output switching switch 111 sets to AC-connected state 111a (Step S202).

Since a power source identity signal is not being received, mode switching unit 224 does not switch the operation mode of power conversion control unit 221. Therefore, power conversion control unit 221 remains set in the first mode, and as a result, the first mode controller 241 controls power conversion unit 215 in the first mode in accordance with the notch command signal (Step S203).

In this way, the power supplied from the first power source which is an AC power source, is converted, in response to the notch command signal, into power for driving motor 105 and then supplied to motor 105. Therefore, electric rolling stock can run on the first power.

When it is recognized that power source identity signal has been received (Step S201; YES), mode switching unit 224 outputs to power source output switching switch 111 a signal indicating that the power source is a DC power source. Power source output switching switch 111 sets to DC-connected state 111b (Step S204).

Mode switching unit 224 recognizes the value indicated by the received power source identity signal (Step S205). When it is recognized that the power source identity signal indicates 1 (Step S205; =1), mode switching unit 224 switches the operation mode of power conversion control unit 221 to the second mode. As a result, second mode controller 242 controls power conversion unit 215 in accordance with the notch command signal (Step S206).

In this way, the power supplied from the second power source which is a DC power source, is converted in response to the notch command signal, into power for driving motor 105 and then supplied to motor 105. Therefore, the electric rolling stock can run on the second power.

When it is recognized that the power source identity signal indicates 2 (Step S205; =2), mode switching unit 224 switches the operation mode of power conversion control unit 221 to the third mode. As a result, the third mode controller 243 controls power conversion unit 215 in accordance with the notch command signal (Step S207).

In this way, the power supplied from the third power source which is a DC power source, is converted in response to the notch command signal, into power for driving motor 105 and then supplied to motor 105. Therefore, the electric rolling stock can be run on the third power.

As described, when the electric rolling stock is running, it operates according to the type of power source. In this way, the electric rolling stock can run by power supplied from any of three types of power sources.

Figure 8:
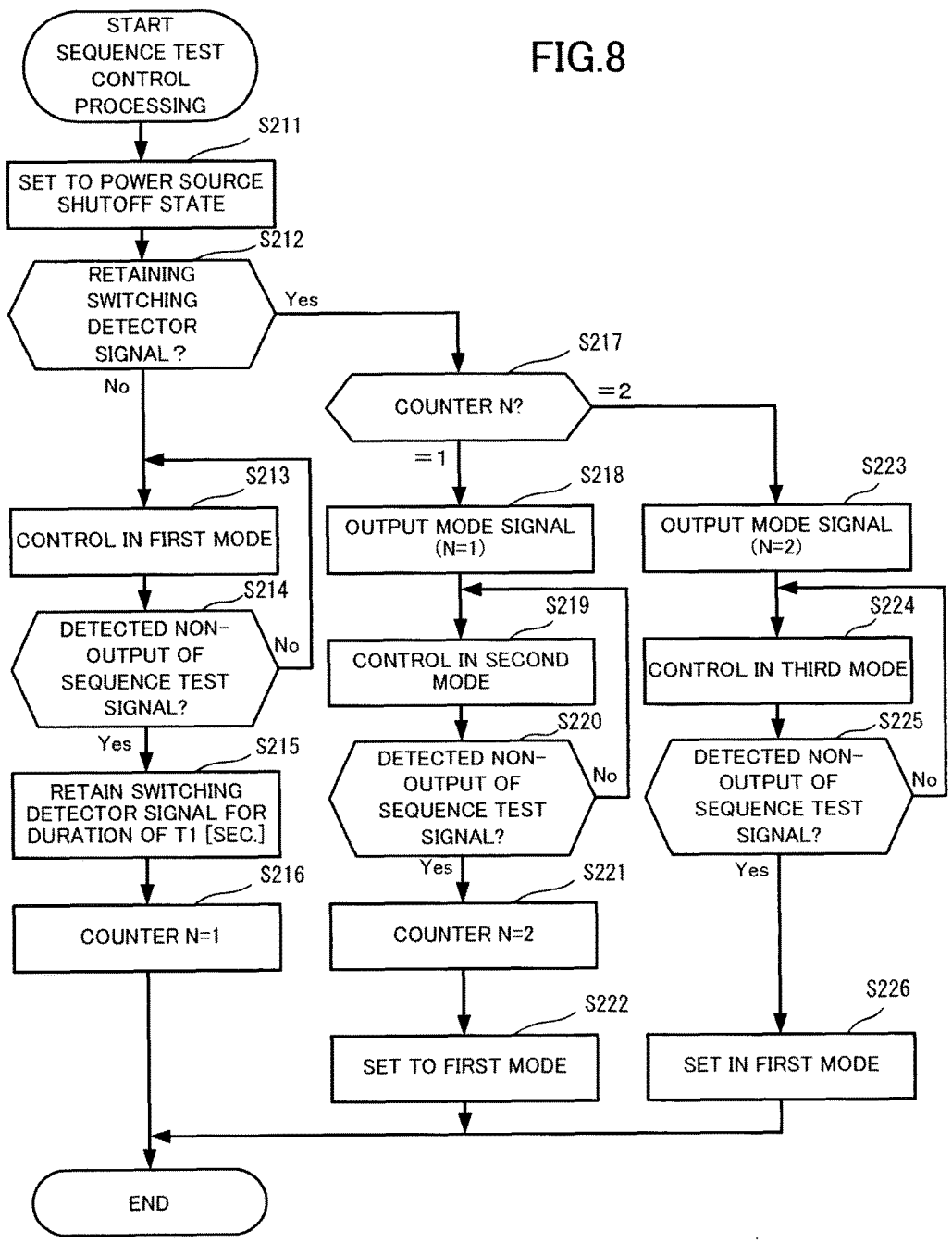
FIG. 8 is a flow chart showing a flow of sequence test control processing in the second embodiment.

While sequence test switch 110 is in the output state, control unit 116 executes sequence test control processing as shown in FIG. 8. In more detail, for instance, when mode switching unit 224 acquires a sequence test signal from sequence test switch 110, control unit 216 begins sequence test control processing. When sequence test control processing begins, the operation mode of power conversion control unit 221 is set to the first mode which is the default mode.

When mode switching unit 224 acquires a sequence test signal from sequence test switch 110, the sequence test signal is output to power source output switching switch 111. Power source output switching switch 111 sets to power source shutoff state 111*c* (Step S211).

When mode signal output unit 223 acquires a sequence test signal from sequence test switch 110, it recognizes whether a switching detector signal is retained (Step S212) as in Step S112 of the first embodiment.

When it is recognized that a switching detector signal is not retained (Step S212; No), mode signal output unit 223 does not output a mode signal, and mode switching unit 224 does not switch the operation mode of power conversion control unit 221. Therefore, power conversion control unit 221 remains set to the first mode. First mode controller 241, in accordance with the notch command signal, executes control in order to cause power conversion unit 215 to execute the first mode conversion operation (Step S213).

At this time, the sequence test can be executed in the first mode because the supply of power to power conversion unit 215 is shut off.

When the sequence test signal is not switched from output to non-output, mode signal output unit 223 does not detect a switch of a sequence test signal from output to non-output (Step S214; No). In this case, the power source output switching switch 111 remains in power source shutoff state 111*c* and first mode controller 241 continues to execute control processing of the first mode (Step S213). In this way, the sequence test of the first mode can be continued.

When the sequence test signal is switched from output to non-output, mode signal output unit 223 detects a switch of a sequence test signal from output to non-output (Step S214; Yes). Mode signal output unit 223 retains a switching detector signal for the fixed time T1 [see.] from the point in time at which switching is detected (reference time) (Step S215).

Mode signal output unit 223 sets counter N to 1 (Step S216). Here, counter N is the counter for counting the number of times the sequence test switch 110 switched from the output state to the non-output state within the fixed time T1 [sec.] from the reference time. For example counter N is retained in mode signal output unit 223. Control unit 216 ends the sequence test control processing.

Thereafter, when sequence test signal is output again from sequence test switch 110, sequence test control processing is executed. With power source output switching switch 111 set to power supply shutoff state 111*c* (Step S211), mode signal output unit 223 recognizes whether a switching detector signal is retained (Step S212).

When the point in time at which the sequence test signal output again is within T1 [sec.] from the reference time set in Step S215, the switching detector signal is retained in mode signal output unit 223. In this case, mode signal output unit 223 recognizes that the switching detector signal is retained (Step S212; Yes), and references the value of counter N retained by mode signal output unit 223. When counter N is 1 (Step S217; =1), mode signal output unit 223 outputs to mode switching unit 224 a mode signal indicating 1 as the mode signal for specifying the second mode. (Step S218).

Note that when the point in time at which the sequence test signal output again is not within T1 [sec.] from the reference time, the switching detector signal is not retained in mode signal output unit 223. Therefore, in this case, mode signal output unit 223 recognizes that a switching detector signal is not retained (Step S212; No), and processing proceeds through previously mentioned Steps S213-S216.

Upon receipt of the mode signal output in Step S218, mode switching unit 224 switches the operation mode of power conversion control unit 221 to the second mode. As a result, second mode controller 242, in accordance with the notch command signal, executes control in order to cause power conversion unit 215 to execute the second mode conversion operation (Step S219).

At this time, the sequence test can be executed in the second mode because power is not being supplied to power conversion unit 215.

When the sequence test signal is not switched from output to non-output, mode switching unit 224 does not detect a switch of a sequence test signal from output to non-output (Step S220; No). In this case, the power source output switching switch 111 remains in power source shutoff state 111*c* and second mode controller 242 continues to execute control processing of the second mode (Step S219). In this way, the sequence test in the second mode can be continued.

When the sequence test signal is switched from output to non-output, mode switching unit 224 detects the switch of the sequence test signal from output to non-output (Step S220; Yes). Mode signal output unit 223 sets counter N to 2 (Step S221). Mode switching unit 224 sets the operation mode of power conversion control unit 221 to the first mode which is the default mode (Step S222). Control unit 216 ends the sequence test control processing.

Thereafter, when sequence test signal is output yet again from sequence test switch 110, sequence test control processing is executed. With power source output switching switch 111 set to power supply shutoff state 111*c* (Step S211), mode signal output unit 223 recognizes whether a switching detector signal is retained (Step S212).

When the point in time at which the sequence test signal output yet again is within T1 [sec.] from the reference time set in Step S215, the switching detector signal is retained in mode signal output unit 223. In this case, mode signal output unit 223 recognizes that the switching detector signal is retained (Step S212; Yes), and references the value of counter N retained by mode signal output unit 223. When counter N is 2 (Step S217; =2), mode signal output unit 223 outputs to mode switching unit 224 a mode signal indicating 2 as the mode signal for specifying the third mode (Step S223).

Note that when the point in time at which the sequence test signal output yet again is not within T1 [sec.] from the reference time set, the switching detector signal is not retained in mode signal output unit 223. Therefore, in this case, mode signal output unit 223 recognizes that a switching detector signal is not retained (Step S212; No), and processing proceeds through previously mentioned Steps S213-S216.

Upon receipt of the mode signal output in Step S223, mode switching unit 224 switches the operation mode of power conversion control unit 221 to the third mode. As a result, third mode controller 243, in accordance with the notch command signal, executes control in order to cause power conversion unit 215 to execute the third mode conversion operation (Step S224).

At this time, the sequence test can be executed in the third mode because power is not being supplied to power conversion unit 215.

When the sequence test signal is not switched from output to non-output, mode switching unit 224 does not detect a switch of a sequence test signal from output to non-output (Step S225; No). In this case, the power source output switching switch 111 remains in power source shutoff state 111*c* and third mode controller 243 continues to execute control processing of the third mode (Step S224). In this way, the sequence test of the third mode can be continued.

When the sequence test signal is switched from output to non-output, mode switching unit 224 detects a switch of a sequence test signal from output to non-output (Step S225; Yes). Mode switching unit 224 sets the operation mode of power conversion control unit 221 to the first mode which is the default mode (Step S226).

Control unit 216 ends the sequence test control processing.

Note that the sequence test control processing shown in FIG. 8 does not include processing for resetting counter N to 0 but counter N can be reset, for instance, when the fixed time T2 (≥T1) [sec.] from the reference time has passed.

In this embodiment, the number of times the sequence test signal is switched from output to non-output within the fixed time T1 [sec.] from the reference time is counted, and the operation mode of power conversion control unit 221 switches according to the counted number.

In this way, by simply performing the predetermined operation to sequence test switch 110, the operation mode switches allowing the sequence test to be executed in a power converter of an electric rolling stock that can run on three types of power sources. Similarly, by associating the number of times N with an operation mode, the operation mode can be switched and the sequence test can be executed even in a power converter of an electric rolling stock that can run on four or more types of power sources, by simply performing a predetermined operation to sequence test switch 110. Thus, it becomes possible to easily execute a sequence test in response to three or more different types of power sources with a simple configuration.

Figure 9:
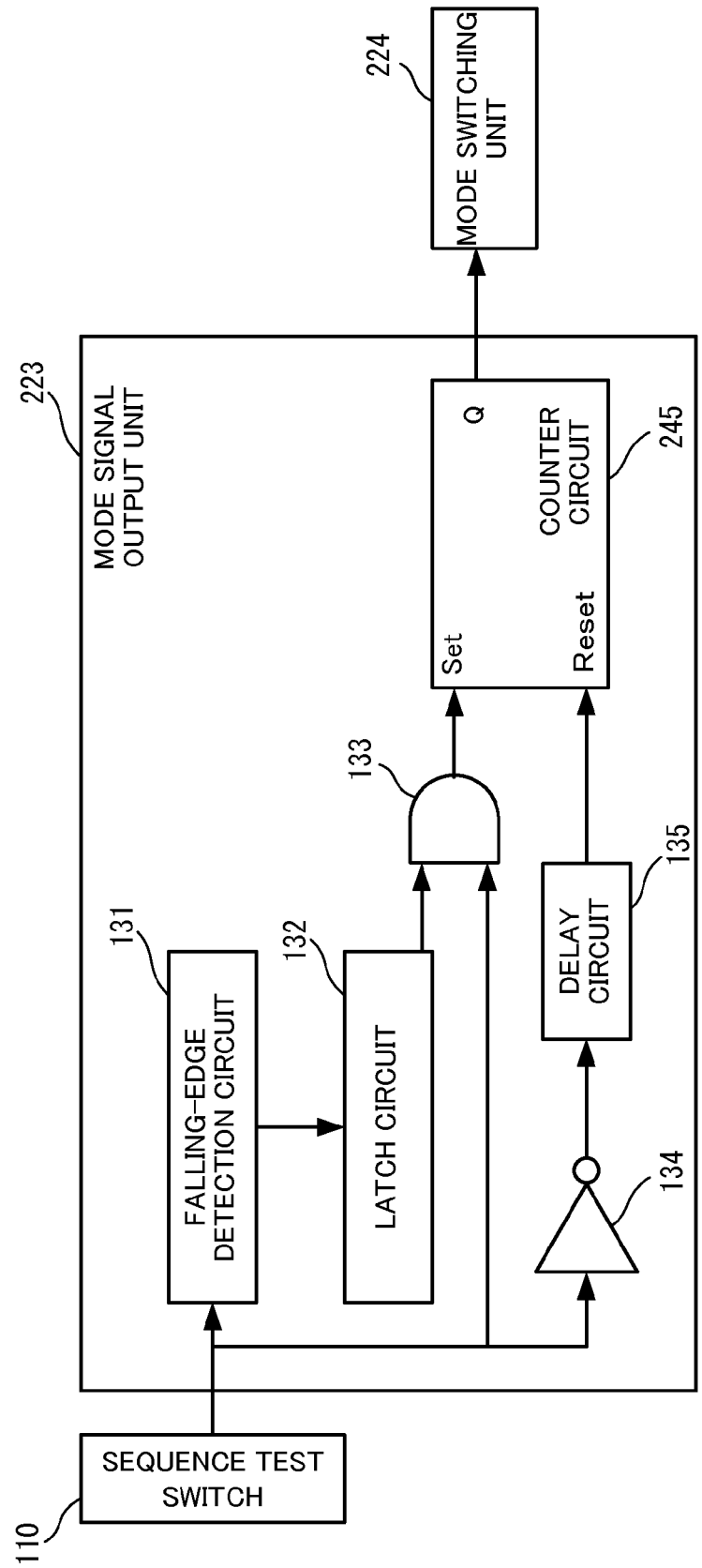
FIG. 9 is a logic circuit diagram showing a configuration of a mode signal output unit in the second embodiment.

Note that control unit 216 of the present invention, like control unit 116 of the first embodiment, can be comprised of a processor incorporating a predetermined software program, or can be comprised of either a logic circuit or a combination of the processor and logic circuit. FIG. 9 shows an example of mode signal output unit 223 that is configured as a logic circuit. As shown in the same diagram, mode signal output unit 223, unlike RS-FF circuit 136 of mode signal output unit 123 shown in FIG. 5, includes a counter circuit 245.

Counter circuit 245 retains counter N which has a maximum value of 2. When counter circuit 245 acquires Set signal, counter N increases by one increment, and, based on value of counter N, outputs the predetermined signal to mode switching unit 224 while retaining that state. When the Reset signal is acquired, RS-FF circuit 136 resets the value of counter N to 0. In other words, the signal output by RS-FF circuit 136 corresponds to the mode signal explained in the first embodiment. Note that the maximum value for counter N can be set to any value. For instance, in cases when counter N is two or more, the third mode can be associated.

Third Embodiment

Electric rolling stock 300 of this embodiment, just like the electric rolling stock 100 in the first embodiment, is an AC/DC dual purpose electric rolling stock that can run by power supplied from two types of power source 101, and is made up of a plurality of train carriages 347*a*-347*c*.

Figure 10:
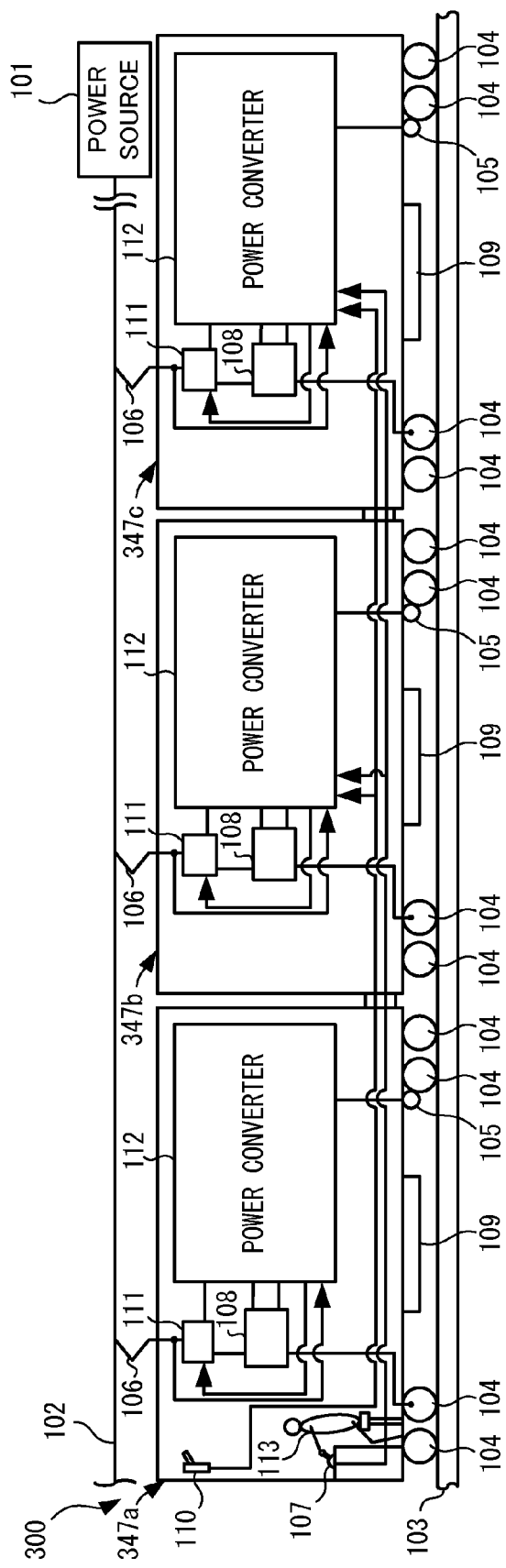
FIG. 10 is a diagram showing a schematic configuration of an electric rolling stock in a third embodiment.

Carriages 347*a*-347*c*, like in the first embodiment, each include wheels 104, motor 105, current collector 106, transformer 108, battery 109, power source output switching switch 111, and power converter 112. While FIG. 10 illustrates an example of train carriages 347*a*-347*c* each mounted with a power converter 112, power converter 112 may be mounted in only some of the train carriages 347*a*-347*c* that make up electric rolling stock 300.

Only the front train carriage 347 further includes master controller 107 and sequence test switch 110.

Power converter 112 mounted in each train carriage 347*a*-347*c* acquires notch command signals from master controller 107 and sequence test signals from sequence test switch 110.

According to this embodiment, each power converter 112 controlled in accordance with the operation of master controller 107 enables the running of an electric rolling stock. Also, as in the first embodiment, the operation of a single sequence test switch 110 makes it possible to execute, in the operation mode according to the type of power source 101, a sequence test of power converter 112 in all the train carriages 347*a*-347*c*.

Although present disclosure has been described with respect to specific embodiments, it will be appreciated that the present disclosure is not limited to the embodiments and is intended to cover all modifications and equivalents within the technical scope.

INDUSTRIAL APPLICABILITY

The present disclosure can be applied to electric rolling stock that can run on a plurality of power types, power converters mounted in electric rolling stock that can run on a plurality of power types, and sequence tests of electric rolling stock that can run on a plurality of power types.

REFERENCE SIGNS LIST

100, 300 Electric rolling stock
101 Power source
105 Motor
107 Master controller
110 Sequence test switch
111 Power source output switching switch
112, 212 Power converter 115, 215 Power conversion unit
116, 216 Control unit
121, 221 Power conversion control unit
122 DC power source detector
123, 223 Mode signal output unit
124, 224 Mode switching unit
125 AC mode controller
126 DC mode controller
222 Power source identifier unit
241 First mode controller
242 Second mode controller
243 Third mode controller
347a-347c Train carriage

The invention claimed is:

1. A power converter comprising:
a power conversion unit that performs a first through a nth conversion operation that converts a first through a nth power, n being an integer of two or more, respectively into load-driving power supplied to a load;
a shutoff switch that, in response to an output of a sequence test signal instructing execution of a sequence test, shuts off a supply of power from a power source to the power conversion unit, wherein the sequence test is a test that checks whether a control circuit of electric rolling stock is operating normally while the supply of power from the power source to the power conversion unit is shut off; and
a control unit that,
when any of the first through the nth power is being supplied to the power conversion unit, executes any of a first through a nth control in order to cause the power conversion unit to execute the conversion operation corresponding to the power being supplied, and
when the sequence test signal has been output and the supply of power to the power conversion unit has been shut off by the shutoff switch, executes any of the first through the nth control in accordance with a switching history defined as the number of times the sequence test signal is switched from output to non-output within a fixed time.

2. The power converter according to claim 1, wherein
the control unit comprises:
a power conversion control unit that executes any of the first through the nth control;
a switching signal output unit that outputs a switching signal in order to specify the nth control in accordance with the history of switching between output and non-output of the sequence test signal when the sequence test signal is output; and
a switching unit that,
when any of the first through the nth power is being supplied to the power conversion unit, causes the first through the nth controls to be executed,
when the switching signal and the sequence test signal have been output and the supply of power to the power conversion unit has been shut off by the shutoff switch, causes the power conversion control unit to execute the nth control, and
when sequence test signal is output without the switching signal being output and the supply of power to the power conversion unit has been shut off by the shutoff switch, causes the power conversion control unit to execute the first control.

3. The power converter according to claim 1, wherein
the power conversion unit performs the first or a second conversion operation that converts the first or a second power into the load-driving power that is supplied to the load; and
the control unit,
when the first or the second power is being supplied to the power conversion unit, executes either the first or a second control in order to cause the power conversion unit to execute a corresponding conversion operation, and
when the sequence test signal has been output and the supply of power to the power conversion unit has been shut off by the shutoff switch, executes either the first or the second control in accordance with the switching history.

4. The power converter according to claim 1, wherein
the control unit executes any of the first through the nth control, when the sequence test signal has been output and the supply of power to the power conversion unit has been shut off by the shutoff switch, in accordance with the history of the sequence test signal that was switched from non-output to output within a fixed time before the sequence test signal is output.

5. The power converter according to claim 1, wherein
the control unit executes any of the first through the nth control, when the sequence test signal has been output and the supply of power to the power conversion unit has been shut off by the shutoff switch, in accordance with the number of times the sequence test signal was switched from non-output to output within the fixed time before the sequence test signal is output.

6. An electric rolling stock comprising:
a traction motor that applies driving force to wheels;
a power conversion unit that performs a first through a nth conversion operation that converts a first through a nth power, n being an integer of two or more, respectively into power for driving the traction motor that is supplied to the traction motor;
a sequence test switch that switches output and non-output of a sequence test signal instructing execution of a sequence test that is a test that checks whether a control circuit of electric rolling stock is operating normally while the supply of power from the power source to the power conversion unit is shut off;
a shutoff switch that shuts off the supply of power from a power source to the power conversion unit in response to an output of the sequence test signal; and
a control unit that,
when any of the first through the nth powers is being supplied to the power conversion unit, executes any of a first through a nth control in order to cause the power conversion unit to execute the conversion operation corresponding to the power being supplied, and
when the sequence test signal is output and the supply of power to the power conversion unit is shut off by the shutoff switch, executes any of the first through the nth controls in accordance with a switching history defined as the number of times the sequence test signal is switched from output to non-output within a fixed time.

7. The electric rolling stock according to claim 6, comprising
a plurality of train carriages, wherein
two or more of the plurality of train carriages each include the traction motor, the power conversion unit and the control unit.

8. A method for controlling a sequence test comprising:
shutting off a supply of power from a power source to a power conversion unit in response to an output of a sequence test signal instructing execution of the sequence test, wherein the sequence test is a test that checks whether a control circuit of electric rolling stock is operating normally while the supply of power from the power source to the power conversion unit is shut off, and executing any of a first through a nth control in order to cause the power conversion unit to execute any of a first through a nth conversion operation, n being an integer of two or more, that converts a first through a nth power respectively into load-driving power supplied to a load in accordance with a switching history defined as the number of times the sequence test signal is switched from output to non-output within a fixed time when the sequence test signal is output.

* * * * *